United States Patent
McCandless

(10) Patent No.: US 6,251,701 B1
(45) Date of Patent: Jun. 26, 2001

(54) ALL-VAPOR PROCESSING OF P-TYPE TELLURIUM-CONTAINING II-VI SEMICONDUCTOR AND OHMIC CONTACTS THEREOF

(75) Inventor: Brian E. McCandless, Elkton, MD (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 09/516,686

(22) Filed: Mar. 1, 2000

Related U.S. Application Data

(60) Provisional application No. 60/122,492, filed on Mar. 2, 1999.

(51) Int. Cl.$^7$ .................................................. H01L 21/00
(52) U.S. Cl. ........................... 438/95; 438/98; 438/603; 136/252; 136/260; 136/264; 136/265
(58) Field of Search .................................... 136/243, 252, 136/258, 260, 264, 265; 438/95, 98, 603

(56) References Cited

PUBLICATIONS

McCandless et al., "A Treatment to Allow Contacting CdTe With Different Conductors", ., Proceedings of the 24th IEEE Photovoltaic Specialists Conference, V 1, p 107–110, 1994.*

* cited by examiner

Primary Examiner—Tuan H. Nguyen
Assistant Examiner—Asok Kumar Sarkar
(74) Attorney, Agent, or Firm—Mark F. LaMarre; Thomas G. Anderson; Paul A. Gottlieb

(57) ABSTRACT

An all dry method for producing solar cells is provided comprising first heat-annealing a II-VI semiconductor; enhancing the conductivity and grain size of the annealed layer; modifying the surface and depositing a tellurium layer onto the enhanced layer; and then depositing copper onto the tellurium layer so as to produce a copper tellurium compound on the layer.

15 Claims, 6 Drawing Sheets

US 6,251,701 B1

ALL-VAPOR PROCESSING OF P-TYPE TELLURIUM-CONTAINING II-VI SEMICONDUCTOR AND OHMIC CONTACTS THEREOF

This application claims priority from Provisional Patent Application No. 60/122,492, filed Mar. 2, 1999.

CONTRACTUAL ORIGIN OF THE INVENTION

The United States Government has rights in this invention pursuant to a Contract between the U.S. Department of Energy and the University of Delaware.

BACKGROUND OF THE INVENTION

1. Field of the Invention

This invention relates to a method for producing semiconductors, and more specifically, this invention relates to an all-vapor method for producing p-type tellurium-containing II-VI Semiconductor and Ohmic Contacts thereof.

2. Background of the Invention

Semiconductors are made from foundation material having electrical conductivity intermediate to metals and insulators. This foundation material primarily consists of crystalline material (for example silicon and germanium) having a small number of free electrons which have escaped from their respective atoms. The electron-lacking atoms possess vacancies called holes which are also able to move throughout the crystalline material.

Conductivity of the crystalline lattice can be modified with dopants. For example, some dopants (e.g., arsenic, nitrogen, phosphorous, bismuth) release free electrons, thereby making the lattice more conductive. Such a more conductive lattice is called an n-type semiconductor and has more electrons than holes.

Other dopants (e.g. aluminum, boron, gallium, indium) scavenge free electrons, thereby making the lattice less conductive, i.e. more insulative. Such a less conductive lattice is called a p-type semiconductor.

II-VI semiconductors (whereby the II-VI designate Group II-VI elements of the periodic table) are nonlinear optical materials which experience a change in their electrical charge distribution when exposed to light. As such, these materials have potential in solar cell manufacture and related areas such as optical switching. Further, existing art has demonstrated numerous methods for depositing thin polycrystalline films of these semiconductors.

The fabrication of solar cells incorporating tellurium-containing II-VI semiconductors (e.g. CdS/CdTe materials) is known to increase conversion efficiency but involves processing that is potentially costly with respect to hazardous reagents and waste products. This is partly because the fabrication of solar cells produces secondary waste streams during acid rinsing and etching steps required in their conventional manufacture. Customary fabrication of these II-VI type cells involves the aforementioned acid rinsing and etching steps.

Existing technologies for fabricating CdS/CdTe thin-film solar cells (see, for example U.S. Pat. Nos. 4,456,630 and 4,873,198) rely on wet chemistry steps to accomplish various chemical and electronic modifications of the CdS/CdTe layers and the Cd/Te surface. For example, increased grain size and doping are achieved by thermally activated treatment of the CdS/CdTe structure with $CdCl_2$, which is typically applied from liquid solution. Any excess $CdCl_2$ is then rinsed from the structure as waste or else captured for recycling.

After this chlorine treatment, it is still necessary to modify the CdS/CdTe structure before ohmic contact can be made. This is accomplished by etching with, for example, nitric acid or hydrazine, all of which must be collected and disposed of as waste. In the specific case of these reagents, their innate properties are not conducive to use in a safe, low-cost manufacturing facility.

Another problem inherent with the conventional fabrication of these tellurium-containing II-VI semiconductors is the susceptibility to spatial variability and irreproducibility depending on the uniformity of the $CdCl_2$ layer. Acid rinsing and etching create non-uniformity of the $CdCl_2$ layer itself and non-uniformity between successive fabrications of these $CdCl_2$ layers.

Another obstacle in the conventional technology is that in light of the aforementioned waste problems, fabrication can be difficult to manage over large module areas, up to 20 square feet per module. Module fabrication processes would have to contend with the application, recovery and recycling of the $CdCl_2$ containing solutions.

A need exists in the art for a method in which $CdCl_2$ chemical species are uniformly reacted with the CdTe surface. A need also exists for a method in which deposition of a $CdCl_2$ layer can be eliminated from the processing. Following the reaction with $CdCl_2$, a need exists for forming a highly conductive p-type surface on the CdTe to facilitate forming ohmic contact. Lastly, a need exists in the art to facilitate large module fabrication.

SUMMARY OF THE INVENTION

It is an object of the present invention to provide a method for fabricating p-type tellurium-containing group II-VI semiconductors and ohmic contacts that overcomes the disadvantages of the prior art.

Another object of the present invention is to provide a low-cost II-VI semiconductor. A feature of the method is an all-dry fabrication process. An advantage of the present invention is that excessive amounts of liquid reactant and etching materials are obviated, thereby reducing manufacturing costs and pollution from secondary waste streams, while also increasing production efficiency.

Yet another object of the present invention is to enhance the quality control in photovoltaic manufacture. A feature of the invention is employing a means for applying and maintaining a uniform ohmic contact layer on the semi-conductor foundation material. An advantage of the invention is that the method allows reproducibility of the desired thickness of the ohmic contact layer. Still another advantage of the present invention is that the action of the $CdCl_2$ on the CdTe/CdS structure can be analytically quantified.

Yet another object of the present invention is to provide a method which produces uniform film properties. A feature of this method is that the concentrations of the various vapor phase reactants are controlled by temperature. An advantage of this method is that uniform deposition of layers in the structure is accomplished.

A further object of the present invention is to provide a method which can be managed over large module areas. A feature of this method is that the handling of materials is limited to solid and gaseous phases. An advantage of this method is that it is more amenable to large area manufacturing.

Briefly, the invention provides a method for solar cells, the method comprising heating a film of a tellurium-containing compound; treating said heated film in the presence of a halogen-containing vapor; subjecting said treated film to a reducing agent such as hydrogen and tellurium vapors so as to minimize the concentration of oxides on the film; forming a tellurium layer onto the subjected film; depositing copper onto the tellurium layer to create copper telluride; treating the copper telluride with heat; and depositing a conductor onto the copper telluride.

Also provided is an all dry method for fabricating tellurium-containing semiconducting material, the method comprising annealing a polycrystalline material; and subjecting the annealed material to halogen at a temperature and for a time sufficient to increase grain sizes of the material and to produce a p-type semiconducting material.

BRIEF DESCRIPTION OF THE DRAWING

The invention together with the above and other objects and advantages of the present invention will be best understood from the following detailed description of the preferred embodiment of the invention shown in the accompanying drawing, wherein.

DETAILED DESCRIPTION OF THE INVENTION

An all dry process for fabricating II-VI semiconductors has been invented. The vapor-phase enhances the quality control of the process while also optimizing delivery of reacting species to a II-VI polycrystalline underlayment.

Specifically, an all-vapor-phase method is provided to fabricate p-type tellurium-containing II-VI semiconductors and ohmic contacts thereof. As such, the conventional wet chemistry steps involved in rinsing and etching dopants on the underlying polycrystalline structure (e.g. CdTe) have been eliminated.

Figure 1:
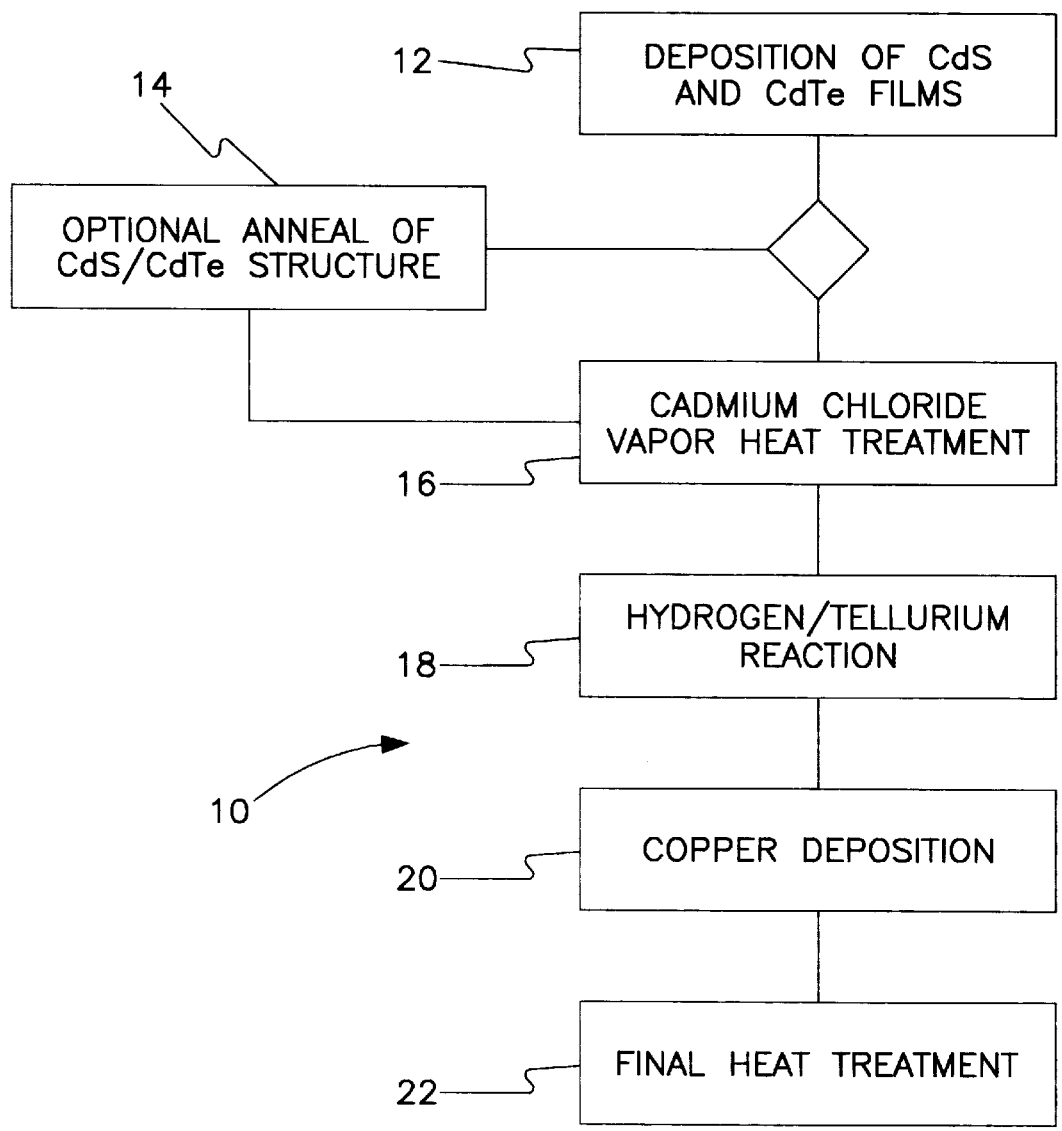
FIG. 1 is a schematic depiction of the invented process.

FIG. 1 schematically depicts the invented process as numeral 10. First, deposition 12 of CdS and CdTe films onto a glass substrate occurs. As an optional step 14, annealing of the CdS/CdTe structure follows. The film is then subjected to a $CdCl_2$ vapor heat treatment 16. Subsequently, tellurium is deposited onto the film 18, and then copper is deposited onto the film 20 in a non-oxidizing atmosphere. The sequence of tellurium and copper deposition can be reversed.

The construct is then subjected to a final heat treatment 22 so as to produce a copper (I) telluride phase. Formation of the $Cu_2Te$ film is thermodynamically favored, given sufficient quantities of copper and tellurium, as is achieved by heat treatment in a neutral atmosphere (e.g. inert, under vacuum, or a non-oxidizing environment).

Figure 2:
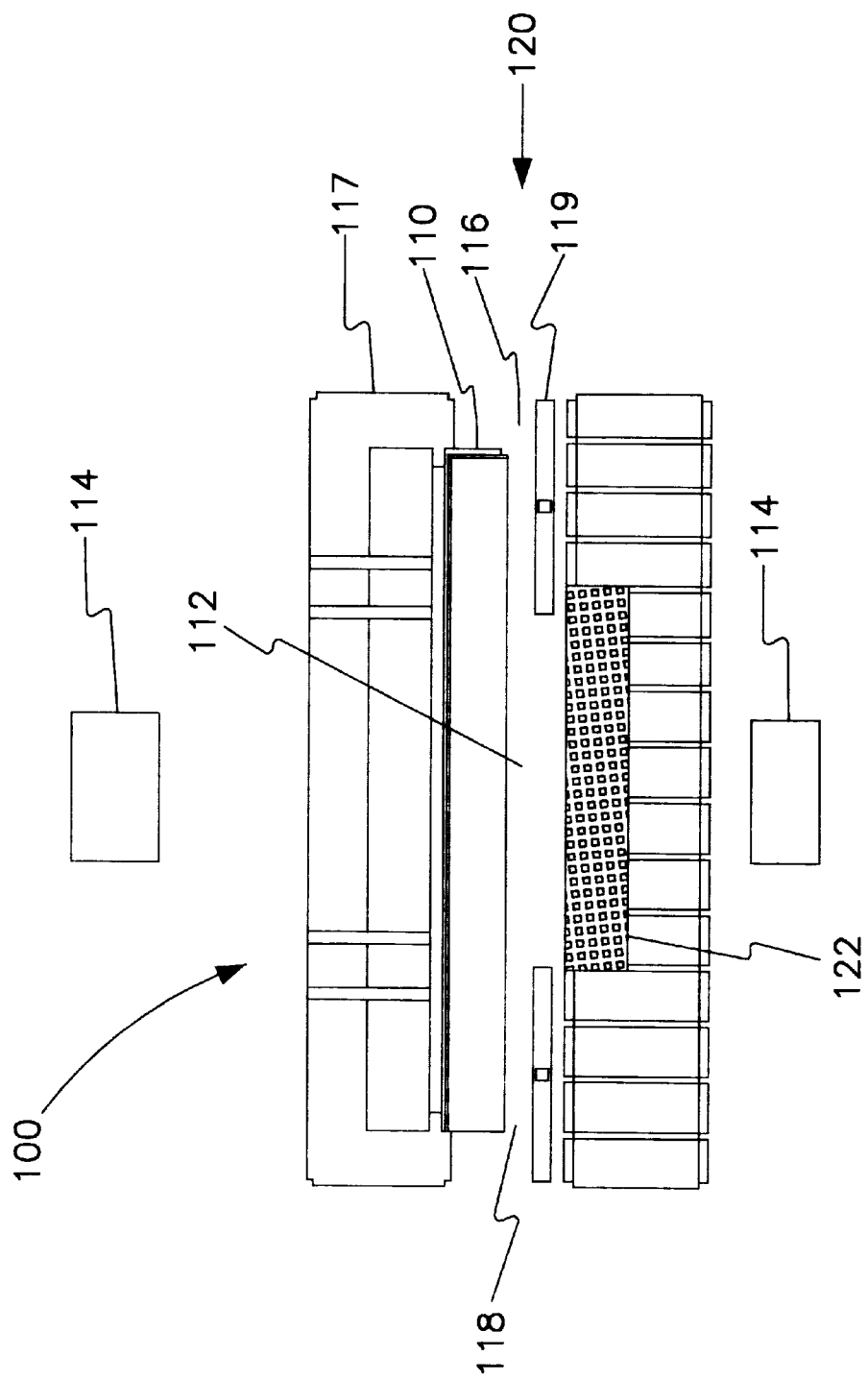
FIG. 2 is a diagram of the reaction chamber utilized to perform the invented method.

An exemplary vapor treatment reactor in accordance with features of the invented device is depicted in FIG. 2, as numeral 100. Generally, a polycrystalline substrate 110, serving as the semi-conductor foundation material, is placed in a reaction chamber 112 so as to be juxtaposed to a heating source 114. The reaction chamber further comprises a means of ingress 116 and egress 118 adapted to receive and evacuate a fluid 120. The fluid 120 provides the means for evacuating the reaction chamber of unwanted atmospheric conditions and subsequently maintaining the reaction chamber at a desired atmosphere and pressure.

The reaction chamber 112 also defines a region 122 to contain reactant solids. Typically, this region is juxtaposed intermediate the polycrystalline substrate 110 and the heating means 114. Graphite susceptors 117 are provided to provide a constant source of heat radiation. Mica masks 119 prevent exposure of certain regions of the polycrystalline semi-conductor to heat.

During the halogen treatment phase, halogen containing reactant is confined to the reactant solid containment region 122 for subsequent vaporization and deposition onto the substrate 110. Likewise, during the Tellurium layer deposition phase, Tellurium source powder is positioned in the reactant solid containment region 122 for subsequent vaporization.

A unique feature of the invented method is its ability to temperature-regulate the various vapor-phase reactions so as to minimize residue collection on the surfaces being prepared. For example, during the cadmium chloride treatment phase, heating of the reaction zone susceptors can be stopped or otherwise changed to cease any further vaporization of the cadmium chloride powder. At that juncture, any vapor phase cadmium chloride would sublimate back onto the powder reservoir, and along with it, any chloride residuals. As such, no residual reactants are left on the substrate surface construct. Similarly, during the tellurium phase of the process, a temperature differential can be maintained between the CdTe film and the tellurium source such that a controlled quantity of tellurium deposits onto the CdTe surface.

Inasmuch as vapor processing is a salient feature of the invented method, a range of partial pressures are suitable to effect changes in the film morphology. Generally, for $CdCl_2$ treatment, suitable $CdCl_2$ partial pressures are selected from between 0.1 Torr to 100 Torr. The useful oxygen partial pressure range is 10 mTorr to 500 Torr.

For Hydrogen/Te treatment, the suitable H2 partial pressures are from approximately 1 Torr to 760 Torr. The useful range of Te partial pressure is 10 mTorr to 100 Torr.

Typical operation conditions for the cadmium chloride vapor treatment step are as follows:

Temperature of the CdTe=420° C.;
Temperature of the $CdCl_2$=415° C.;
Reaction Time=20 minutes
Ambient Gas=Dry Air
Flow Rate=1 L/min; and
Total Pressure=760 Torr.

Typical operating conditions for the Tellurium deposition phase:

Temperature of the CdTe=300° C.;
Temperature of the Te=400° C.;

Reaction time=5 minutes;
Ambient gas=Hydrogen:Argon;
Flow Rate=1 L/min; and
Total Pressure=760 Torr.
Grain Size
Preparation Detail A first step in the invented process is enhancing the conductive and electrical transport properties of the grains in the film. Larger grain size, >100 nm diameter, and well-doped grain surfaces ensure that the photo-carriers generated during sun exposure are collected by the contacts instead of recombined, i.e., lost, at the grain boundary.

Halogen vapor treatment enhances grain size of the II-VI film, but without the concomitant formation of cadmium chlorate residues associated with wet processes. This single-step halogen vapor treatment process provides an economical alternative to the multi-step halogenation process found in wet-chemistry procedures.

Figure 3A:
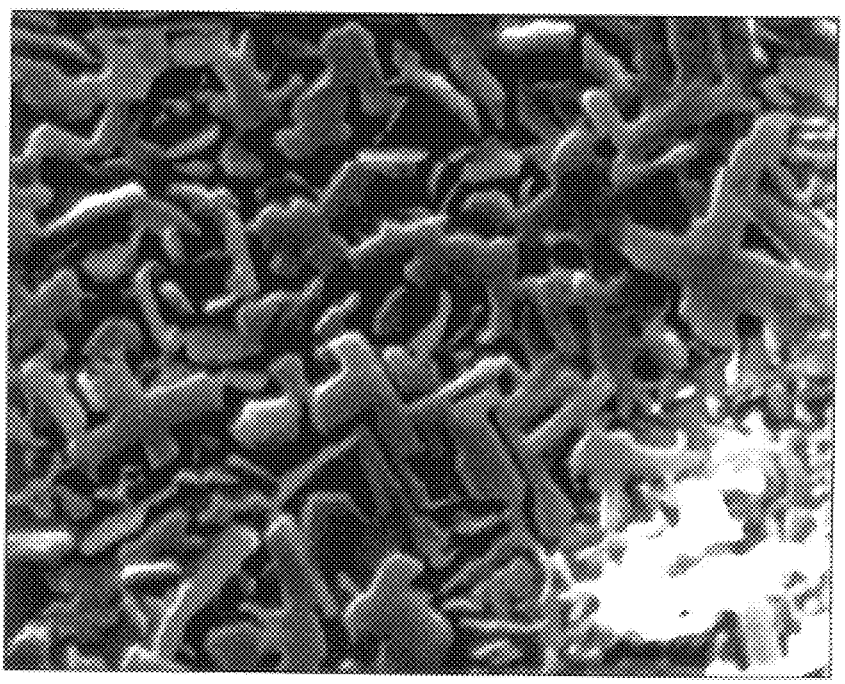
FIG. 3A is a photomicrograph of a surface produced using wet-chemistry prior art.
Figure 3B:
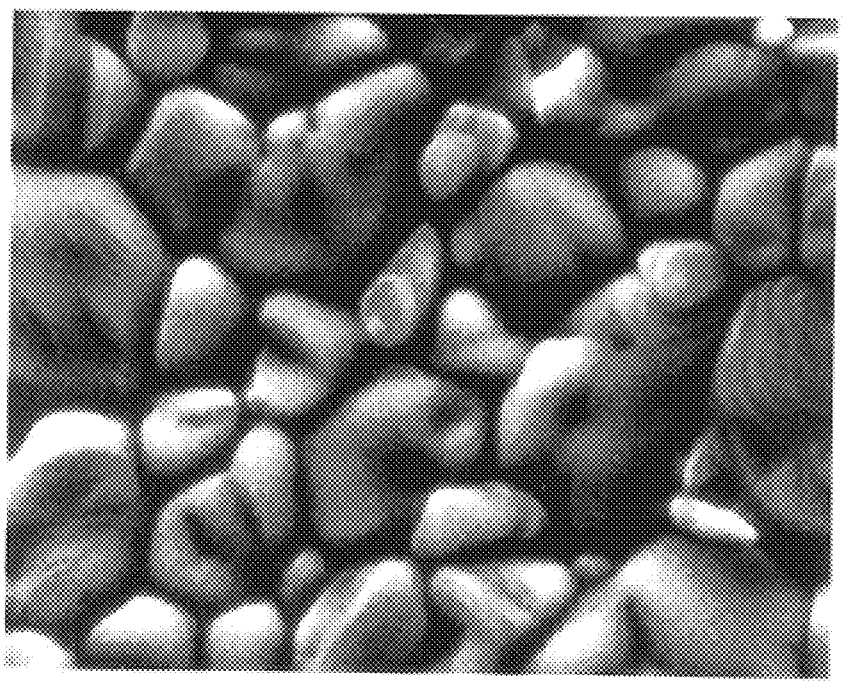
FIG. 3B is a photomicrograph of a surface produced via the all dry process, in accordance with features of the present invention.

A comparison of the results of the invented all-vapor treatment to a typical wet-process treatment is illustrated in FIGS. 3A and 3B. FIGS. 3A and 3B are scanning electron micrographs at 2000× magnification of a CdTe surface after reaction with $CdCl_2:O_2$. FIG. 3A is depicts the film after undergoing conventional wet process (sample coated with $CdCl_2$:methanol, dried, then heated). That surface shows cadmium oxide residues in the lower right hand corner of the micrograph and a cross-linked network of cadmium chlorate over the entire surface.

FIG. 3B depicts the film after vapor treatment (i.e., heated in $CdCl_2:O_2$ vapor ambient), showing a clean grain surface. Both samples were treated at 420° C. for 20 minutes.

A myriad of halogen-based materials can be utilized to enhance grain sizes of the polycrystalline underlayment. As such, while $CdCl_2$ is used as an example in the instant specification, other halogen-based vapors also are suitable, including, but not limited to, NaCl, KCl, $NH_4Cl$, CuCl, $ZnCl_2$, $CdBr_2$, and combinations thereof.

The $CdCl_2:O_2$ treatment is used to optimize the properties of the CdTe film and CdTe/CdS junction for solar cell operation. Specifically, the treatment relaxes interfacial strain between CdTe and CdS by promoting interdiffusion. The treatment also reduces grain boundary density in films having initially sub-micron grain size. This enhances collection of photogenerated carriers. The treatment also provides Cl and O species for electronic doping of the CdTe layer.

This halogen step also modifies or prepares the exposed CdTe surface for subsequent contact with tellurium and/or copper, and without the need for acid etching or cleaning. As was discussed supra for FIGS. 3A and 3B, a result of wet $CdCl_2$ processes is that the surface contains substantial quantities of chlorides, chlorates, and oxides. As such, and prior to forming a low resistance contact to CdTe, these oxides and residues must be removed, and a Te-enriched layer must be formed to yield ohmic electrical contact. Conventionally, this removal is achieved by immersion of the CdTe film in liquid etchants, such as nitric acid or dichromate solution followed by hydrazine. Afterwards, the surface must be rinsed and dried in preparation for copper deposition.

By contrast, the invented $CdCl_2$-vapor deposition process leaves very thin oxide layers having surface chlorine concentrations of less than 0.1%. As such, liquid etchants are not required.

Halogen Treatment
Chemistry Detail

Halogen treatment modifies the equilibrium of the semiconductor and increases the mobility of free Cd and Te on the polycrystalline surface. This in turn leads to CdTe—CdS intermixing, and migration of the grain boundaries to produce larger grains. At the electronic level, Cl forms solid-state complexes with Cd, leading to Cd vacancies and a net positive charge through hole creation; this enhances the p-type conductivity of the CdTe film.

The overall chemical reaction between gas phase $CdCl_2$ and $O_2$ and solid CdTe is depicted in Equation 1, below:

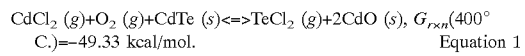

$$CdCl_2\ (g)+O_2\ (g)+CdTe\ (s)<=>TeCl_2\ (g)+2CdO\ (s),\ G_{rxn}(400°\ C.)=-49.33\ kcal/mol. \quad \text{Equation 1}$$

For reactions where solid $CdCl_2$ is in physical contact with CdTe, the solid phase reaction depicted in Equation 2 below occurs. Equation 2 is provided as a basis for comparison between solid and vapor $CdCl_2$ species in contact with solid CdTe.

$$CdCl_2\ (s)+O_2\ (g)+CdTe\ (s)<=>TeCl_2\ (g)+2CdO\ (s),\ G_{rxn}(400°\ C.)=-32.94\ kcal/mol. \quad \text{Equation 2}$$

Of the two reaction sequences, the gaseous interaction is more thermodynamically favored. Processes embodying Equation 2 are accompanied by a concomitant and significant increase in partial pressure of $CdCl_2$ (10 mTorr) at a 400° C. reaction temperature. This system leads to the Guldberg and Waage expression of overall equilibrium, as depicted in Equation 3.

$$K_1=[TeCl_2][CdO]^2/[CdCl_2][O_2][CdTe], \quad \text{Equation 3}$$

in which the quantity of CdO obtained will vary as the square root of $O_2$ concentration. This is significant inasmuch as an enhancement in grain coalescence and inter-diffusion occurs with oxygen partial pressure.

It is also useful to consider the intermediate reaction depicted in Equation 4, which represents the balance between Cd and $O_2$:

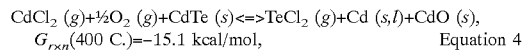

$$CdCl_2\ (g)+\tfrac{1}{2}O_2\ (g)+CdTe\ (s)<=>TeCl_2\ (g)+Cd\ (s,l)+CdO\ (s),\ G_{rxn}(400\ C.)=-15.1\ kcal/mol, \quad \text{Equation 4}$$

with equilibrium constant defined in terms of elemental Cd and molecular CdO, as shown in Equation 5:

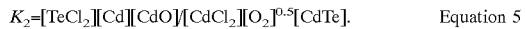

$$K_2=[TeCl_2][Cd][CdO]/[CdCl_2][O_2]^{0.5}[CdTe]. \quad \text{Equation 5}$$

Figure 4:
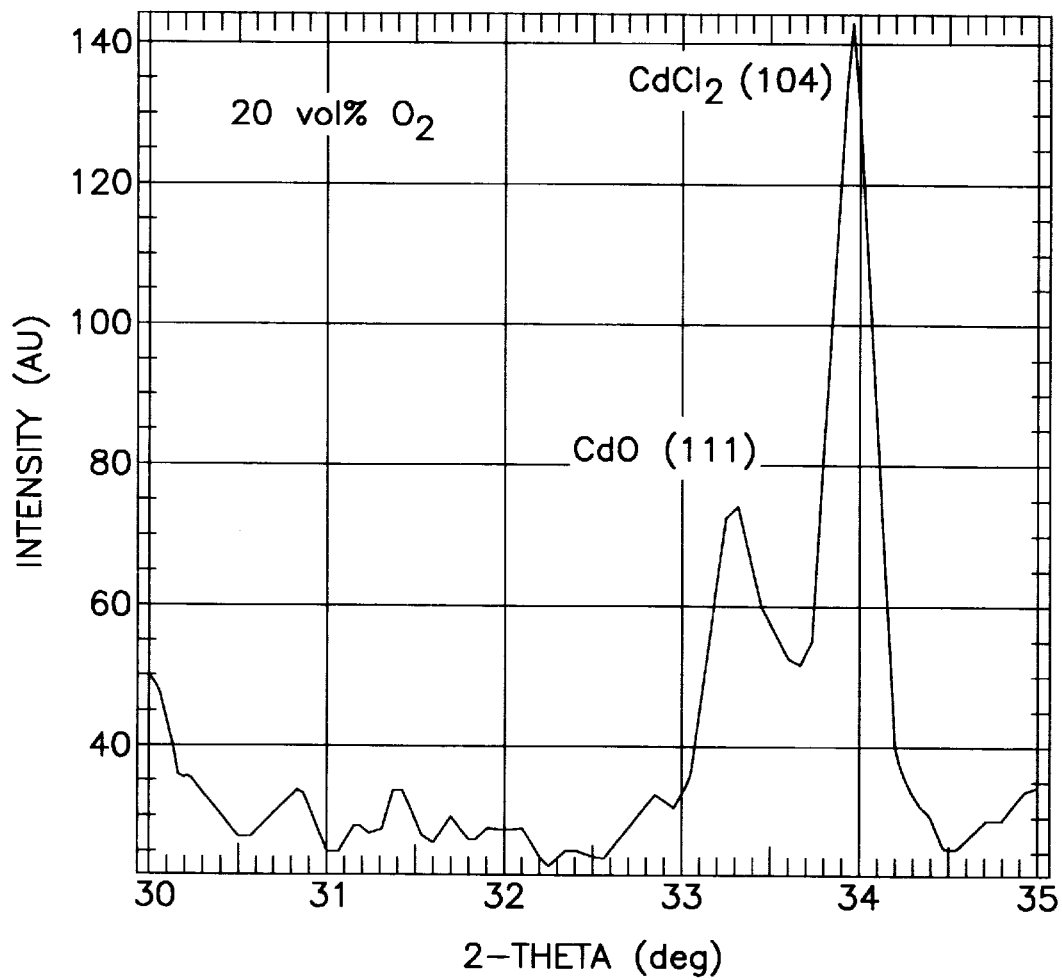
FIG. 4 is an x-ray diffraction pattern of CdTe substrate treated with halogen-containing vapor, in accordance with features of the present invention.

This overall surface chemical basis was qualitatively and quantitatively tested by phase measurements of annealed powder samples (particle size<150 μm) as shown in Table 1 and FIG. 4. Powders were chosen to enhance diffracted x-ray signal from phases present at trace quantities. The powders were dehydrated in vacuum at 300° C. for 15 minutes prior to mixing and therewith were transferred to the heat treatment reactor, which was the same used to process CdTe/CdS thin-films.

TABLE 1

XRD phase results for closed-volume (batch) reaction of powder/gas mixtures at 400° C. for 60 minutes. The $O_2$ concentration was fixed at 20% by volume. Samples were quench-cooled after treatment.

| System | Phases After Treatment |
|---|---|
| $CdTe + O_2 + Ar$ | CdTe |
| $CdCl_2 + O_2 + Ar$ | $CdCl_2$ |
| $CdTe + CdCl_2 + O_2 + Ar$ | $CdTe, CdCl_2, CdO$ |
| $CdTe + CdCl_2 + Ar$ | $CdTe, CdCl_2$ |

To minimize hydration of the $CdCl_2$ powder during the XRD measurement, the XRD pattern was acquired over a small angular range at a rate of 0.025 deg/sec. The angular range was selected to reveal the presence of major peaks of CdO, $CdCl_2$, and $CdCl_2$ hydrates. As Table 1 shows, CdO was detected in $CdTe:CdCl_2$ powders heated in $O_2$/Ar ambient at 400° C. for 1 hour. FIG. 4 shows the x-ray diffraction pattern containing the strongest CdO line (111) and a nearby $CdCl_2$ line for a $CdTe:CdCl_2$ powder treated in 20 vol % $O_2$ and Ar ambient at 400° C. for 1 hour. The Rachinger correction was applied to the raw data to remove Cu-k$\alpha_2$ components from the diffraction pattern. No $CdCl_2$ hydrate peaks were detected in any of the patterns.

In thin-films, the grains of the film are analogous to the particulates of the powder. The quantity of CdO residue obtained on a film depends on the $O_2$ concentration and on the quantity of $TeCl_2$ which can escape the heat treatment zone, since the CdTe and $CdCl_2$ reactants are in abundant supply. This latter condition represents a departure from equilibrium to which the system will react by generating additional products. In the limit, this process is diffusion-limited by the formation of the oxide layer. To examine the effect on film surfaces, glancing incidence x-ray diffraction was carried out on CdTe/CdS samples which were treated in $CdCl_2:O_2:Ar$ vapor. The incident beam angle was 0.5°, which results in a depth penetration on the order of 100 nm.

Figure 5:
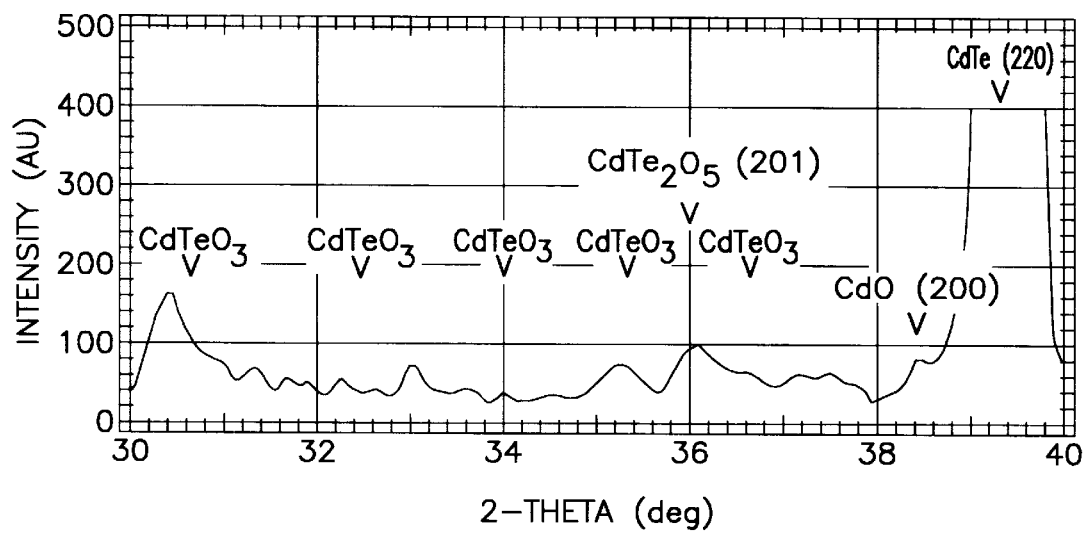
FIG. 5 is a glancing incidence x-ray diffractogram of a CdTe surface reacted in $CDCl_2:O_2:Ar$ vapor in accordance with features of the present invention.

FIG. 5 shows the GIXRD pattern of a sample treated at 420° C. for 20 minutes, revealing the presence of small quantities of CdO and native oxides of CdTe.

The presence of CdO in the films suggests the validity of the proposed chemical basis, with the additional observation of native oxide formation. Note that native oxide formation of CdTe is favored in oxygen-containing ambient at temperatures above 400° C. Equations 1 and 4 above depict the mechanism for grain growth and for CdTe—CdS intermixing. The inventor has found that grain growth and CdTe—CdS intermixing depend strongly on $O_2$ and $CdCl_2$ concentration during the $CdCl_2$ treatment. Inasmuch as glancing-incidence XRD indicates the presence of surfacial CdO, the chemistry of the treatment consists of conversion of the CdTe grain boundary surfaces to free Cd (liquid) and $TeCl_2$ gas, thereby increasing Cd and Te species mobility.

Similar chemistry occurs within the CdS film, resulting in highly mobile Cd, S, and Te species and a high degree of intermixing between CdS and CdTe. The disparity in rates of motion, CdS into CdTe versus CdTe into CdS embodies the differences in the steady state equilibria due to $CdCl_2$ and $O_2$ concentration profiles in the CdS and CdTe films and by the relative sizes of $TeCl_2$ molecules in the CdS matrix and $SCl_2$ molecules in CdTe matrix. Equation 6 below illustrates that the formation of $SCl_2$ is favored:

$$CdCl_2\ (g) + O_2\ (g) + CdS\ (s) <=> SCl_2\ (g) + 2CdO\ (s), G_{rxn}(400° C.) = -12.55\ kcal/mol. \quad \text{Equation 6}$$

When the number of diffusion pathways are restricted by the action of high-temperature film growth or annealing, the degree of grain boundary motion and interdiffusion are reduced. In this case, the beneficial electronic effects of the $CdCl_2:O_2$ treatment are obtained with minimal structural or chemical disturbance within the film. On the exposed surface of CdTe, however, the above chemistry always occurs, leaving a CdO-containing and Cd-enriched layer.

In summary, $CdCl_2$ and $O_2$ react with CdTe at grain surfaces, increasing the mobility of Cd and Te species. When the forces of grain surface motion are balanced, i.e., when equilibrium is achieved between adjacent grains, then the grain growth process ceases. The composition of the remaining grain boundaries and their surfaces then corresponds to the solid-state products of the equilibrium chemistry. An important consequence of this process is the rapid transport of Cl and O species along grain boundaries into the film, modifying the electrical properties of the grain surfaces.

One such means for applying and maintaining a uniform ohmic contact layer is that the CdTe surface, once reacted, is not rinsed or etched prior to making ohmic contact. A key advantage of this method is that no $CdCl_2$ is deposited.

Copper Layer

Deposition Detail

For the sake of illustration, the contacting schemes discussed herein utilize a copper-containing contact or copper layer, plus an activation heat treatment. However, a myriad of conductive materials can be utilized in this aspect of the method. For example, metals such as nickel, chromium, molybdenum, carbon, platinum, gold and tin are suitable. Also, semiconductors such as zinc oxide, indium-tin-oxide and tin oxide are suitable current-carrying conductors that can be applied to the modified CdTe surface.

The application of the conductive metal can be effected in a myriad of ways, including but not limited to electron beam evaporation, sputter deposition, or other vapor deposition techniques.

The degree of post-deposition processing needed to attain the desired CdTe film conductivity depends in part on the technique used to form the CdTe layer, but all cell making processes rely on formation of a p+ layer on the CdTe surface to form the primary contact to CdTe. This p+ layer is brought about by the doping action of Cu along grain boundaries and at the surface. Additionally, chemical and phase analysis of the resulting Te—Cu surface reveals that the low resistance contact operation is facilitated by formation of a very thin $Cu_2Te$ layer between CdTe and the current-carrying material.

The simplest approach to achieve the Cu-doping and $Cu_2Te$ formation is direct deposition of Cu metal, by sputtering or evaporation, onto the Te-enriched surface. Limited experiments also show that Cu-salts such as CuCl can be evaporated at atmospheric pressure onto the Te-enriched surface. The surface equilibrium drives formation of the requisite $Cu_2Te$ during heating in inert atmosphere.

The quantity of Cu deposited is chosen to maintain the $Cu_2Te$ stoichiometry as shown in Table 2.

TABLE 2

Thickness of Cu and Te required for $Cu_2Te$ formation.

| $Cu_2Te$ Thickness Desired (nm) | Te Thickness Required (nm) | Cu Thickness Required (nm) |
|---|---|---|
| 1 | 0.58 | 0.41 |
| 5 | 2.9 | 2.0 |
| 10 | 5.8 | 4.1 |

TABLE 2-continued

Thickness of Cu and Te required for $Cu_2Te$ formation.

| $Cu_2Te$ Thickness Desired (nm) | Te Thickness Required (nm) | Cu Thickness Required (nm) |
|---|---|---|
| 20 | 11.6 | 8.1 |
| 50 | 29.1 | 20.3 |
| 100 | 58.2 | 40.7 |

In summary, the invented process serves to modify film properties while assuring clean reactive surfaces for the fabrication of solar cells. The process minimizes the presence of cadmium chloride and its products as surface residues. Inasmuch as oxides (such as cadmium oxide) are persistent "contaminants" as a result of the halogen treatment and their natural presence with CdTe films, subsequent film preparation steps include a reduction sequence to remove these oxides. Thus, a hydrogen-containing atmosphere during subsequent depositions, for example, during tellurium deposition, will rapidly reduce the oxides to the metal solid. So reduction of CdO leads to Cd.

Excess tellurium reacts with the Cd to form CdTe. Additional Te is deposited to facilitate formation of $Cu_2Te$ when copper is subsequently applied.

EXAMPLE

This example describes the method and chemistry of the all-vapor process used to fabricate solar cells from evaporated CdTe films. Table 3 shows the processing steps employed to fabricate solar cells from evaporated CdTe/CdS structures. For the chemical analysis, we will focus on steps 5 and 6, reaction of CdTe surface with $Te/H_2$ vapor and deposition/reaction of Cu.

TABLE 3

Processing steps used for fabricating evaporated CdTe/CdS solar cells. In the table, "HT" refers to heat treatment of the corresponding structure.

| | |
|---|---|
| 1 | Deposit 10–100 nm CdS onto TCO/glass |
| 2 | HT CdS at 420° C. with $CdCl_2:O_2$ |
| 3 | Deposit 2–6 μm CdTe |
| 4 | HT at 420° C. with $CdCl_2:O_2$ |
| 5 | React with $Te/H_2$ |
| 6 | Deposit 10–40 nm Cu and HT at 200° C. |
| 7 | Apply Current-Carrying Conductor |

As discussed supra, the back surface of the CdTe film contains CdO and native oxides. The net result of the wet chemical contacting process is removed of these oxides and production of a Te layer. However, the invented method facilitates oxide removal and Te-layer production by reacting the CdO-containing surface in an overpressure of Te and $H_2$. As illustrated in Equation 7, the $H_2$ component is essential to obtain oxidation of Cd by Te:

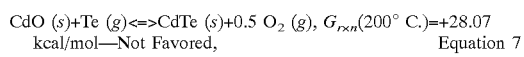

CdO (s)+Te (g)<=>CdTe (s)+0.5 $O_2$ (g), $G_{rxn}$(200° C.)=+28.07 kcal/mol—Not Favored,    Equation 7

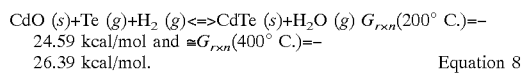

CdO (s)+Te (g)+$H_2$ (g)<=>CdTe (s)+$H_2O$ (g) $G_{rxn}$(200° C.)=−24.59 kcal/mol and $\cong G_{rxn}$(400° C.)=−26.39 kcal/mol.    Equation 8

Reaction 8 above shows that the entire chemical reaction to from CdTe and $H_2O$ is highly favored in the 200–400° C. temperature range. The Te vapor can be generated from a sintered planar powder source at a distance of ~0.5 mm from the surface of the CdTe/CdS sample. At a source temperature of 400° C., the Te partial pressure (as ½ $Te_2$ over solid Te) is ~100 mTorr. Generating excess surface Te is accomplished by maintaining Te supersaturation above the CdTe surface; a temperature differential of ~100° C. causes Te condensation, resulting in a net mass transfer from source to substrate. For the gas phase concentrations involved, steady state is rapidly achieved, and the accumulation of Te on the CdTe surface has been determined to be linear. At 1 atmosphere total pressure, $T_{Te}$=400° C. and $T_{CdTe}$=250° C., the growth rate is ~10 nm/min.

Figure 6:
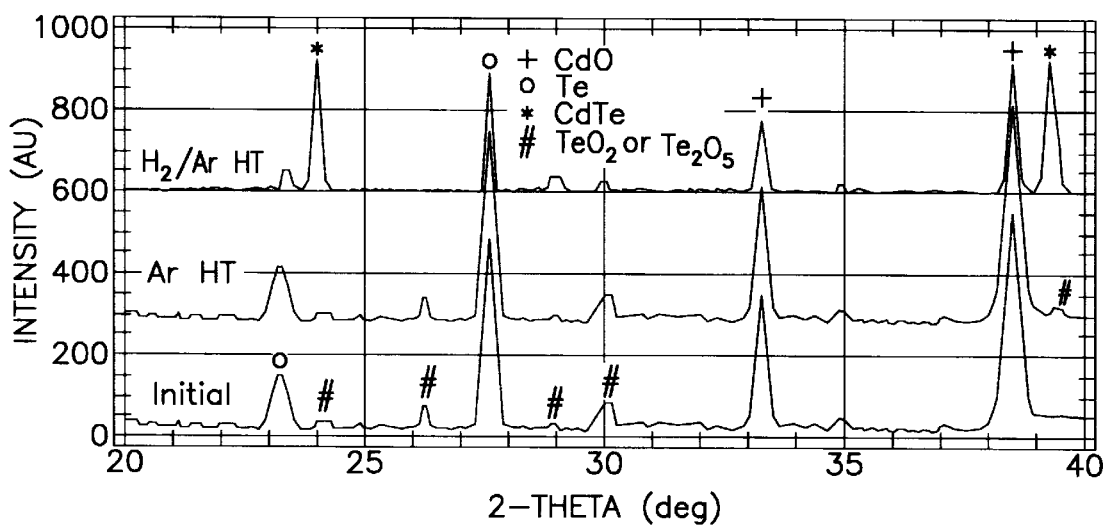
FIG. 6 is an x-ray diffractogram of a reaction of Te and CdO powders with $Te/H_2$, in accordance with features of the present invention.

Initially, experiments were conducted with CdO+Te powders (50–100 μm particle size) in an isothermal reactor at 400° C. in Ar with and without $H_2$ species. The powders were mixed in 1:1 molar ratio of CdO:Te and were heat treated at 400° C. for 30 minutes. FIG. 6 shows powder x-ray diffraction diffractograms for each case; the quantity CdO was reduced, and CdTe was obtained only when the reaction of the CdTe/CdS structure was carried out in $H_2$ ambient, as 4% $H_2$ in balance of Ar. Similar experiments conducted in close-space configuration with CdTe/CdS samples for devices and yielded ohmic forward bias J-V contact behavior only in cases using $H_2$, indicating the necessity for removal of CdO.

As depicted in Equations 9 and 10, rapid transferal of the reacted CdTe samples to the Cu deposition system minimized formation of $TeO_2$, and deposition of Cu followed by in situ vacuum heat treatment at 200° C. produced copper tellurides as in the conventional wet techniques:

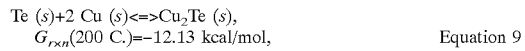

Te (s)+2 Cu (s)<=>$Cu_2Te$ (s), $G_{rxn}$(200 C.)=−12.13 kcal/mol,    Equation 9 and

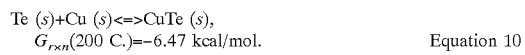

Te (s)+Cu (s)<=>CuTe (s), $G_{rxn}$(200 C.)=−6.47 kcal/mol.    Equation 10

Glancing incidence x-ray diffraction (GIXRD) measurements at 1 degree incidence of 5 nm Cu/>7 nm Te/ITO/glass and of 5 nm Cu/>7 nm Te/CdTe/CdS/ITO/glass thin films confirm the presence of only $Cu_2Te$ (Weissite) phases after Cu deposition plus in situ vacuum heat treatment at 200° C. The tolerable range of Cu excess in the device structure has not been determined, but it is expected that performance will be limited by shunting for d(Cu)>40 nm and formation of oxides The J-V behavior of devices made on these samples exhibited less ohmic behavior as Cu/(Cu+Te) decreased.

As before, the formation of oxides by reaction in air with $Cu_2Te$ or un-reacted Cu is thermodynamically favored:

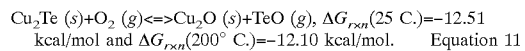

$Cu_2Te$ (s)+$O_2$ (g)<=>$Cu_2O$ (s)+TeO (g), $\Delta G_{rxn}$(25 C.)=−12.51 kcal/mol and $\Delta G_{rxn}$(200° C.)=−12.10 kcal/mol.    Equation 11

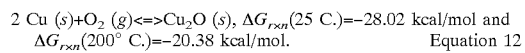

2 Cu (s)+$O_2$ (g)<=>$Cu_2O$ (s), $\Delta G_{rxn}$(25 C.)=−28.02 kcal/mol and $\Delta G_{rxn}$(200° C.)=−20.38 kcal/mol.    Equation 12

Equations 11 and 12 are included to illustrate that the prepared surface is chemically sensitive to oxidation. However, the inventor has found that, in practice, the rate of oxide formation is so slow and the activation treatment is so short that the reaction between Cu and Te can be performed in air without significantly compromising performance.

General Processing

Procedure Detail

CdS/CdTe thin-film samples on indium-tin oxide coated 7059 glass superstrates were treated by an anneal step followed by exposure to CdCl2. The anneal was carried out in vacuum or argon at temperatures from 500° C. to 650° C. to anneal crystallographic defects. These defects have been found to enhance CdS-CdTe interdiffusion; while a limited degree of such intermixing is desirable, excessive intermixing complicates control of device performance. By performing this in an overpressure of CdTe, sublimation of the film is avoided. After the anneal, the films are exposed to $CdCl_2$ vapor generated from $CdCl_2$ powder source that is heated in close proximity to the heated film. This is carried out at temperatures near 420° C. and total pressure of 1 atmosphere in air. After these steps, the CdTe surface is free of residual chloride components and does not require rinsing.

To modify the CdTe surface in a controllable manner for achieving reproducible contacts, a thin tellurium layer is deposited from tellurium vapor generated from a tellurium powder source that is heated in close proximity to the heated film. For this the tellurium source and CdTe/CdS sample are maintained at temperatures of 375° C. and 250° C. respectively, at a total pressure of 1 atmosphere in argon or nitrogen containing hydrogen.

This is followed by the deposition of a stoichiometric or slight excess amount of copper to form $Cu_2Te$. The deposition of copper is achieved through standard electron beam evaporation procedures.

Processing is concluded with a heat treatment done at a slightly elevated temperature of 200° C. in a reduced oxygen ambient, either in vacuum or at atmospheric pressure in a chemically inert ambient such as argon or nitrogen. This treatment completes the reaction to form $Cu_2Te$ and diffuses excess copper into the CdTe layer to provide additional p-type doping, resulting in high performance. The presence of the $Cu_2Te$ phase on the CdTe surface was directly confirmed by $\theta/2\theta$ x-ray diffraction.

After formation of the $Cu_2Te$ layer, conductive electrodes are applied by conventional deposition techniques and require no subsequent treatment.

Figure 7:
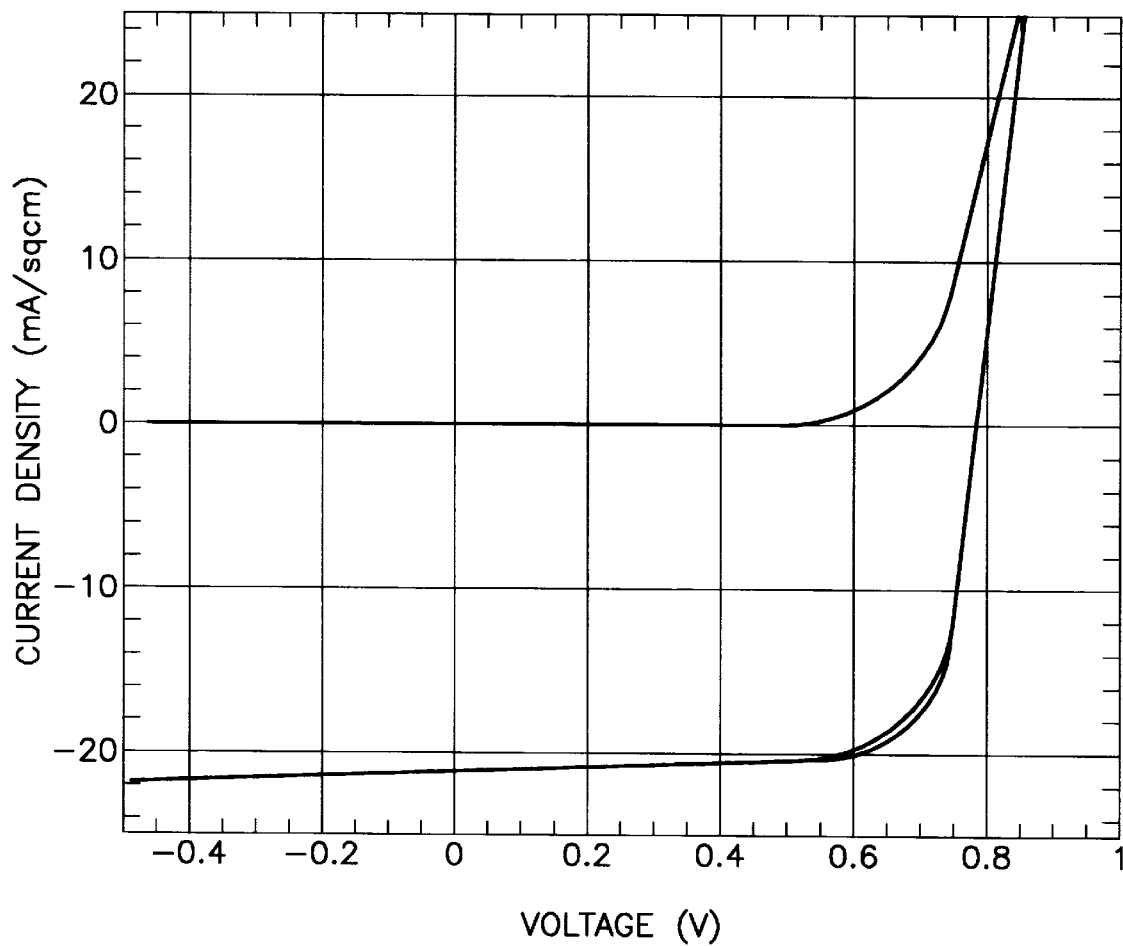
FIG. 7 is a graph depicting light and dark current-voltage behavior of solar cell constructs fabricated by the invented process.

FIG. 7 is a graph showing the light and dark current-voltage (J-V) behavior of solar cells fabricated by the invented all-dry process. From a device perspective, the process yielded superior conversion efficiency for physical vapor-deposited CdTe/CdS films compared to constructs fabricated via typical wet-bench methods. For example, the forward bias characteristics of the J-V curves do not exhibit blocking behavior and yield resistance at Voc of approximately 4 ohm-cm$^2$. This resistance at open circuit voltage and superposition between the light and dark curves indicate that the performance of these devices is not limited by the contact, thereby demonstrating the feasibility of the new treatment and contacting process. Further, the dark and light curves exhibit good superposition, verifying that the conductivity of the semiconductor layers is not a limiting factor in performance.

The area of the fabricated cell was 0.282 cm$^2$, the Voc=790 mV, the Jsc=21.8 mA/cm$^2$, the FF=70.1 percent, and the efficiency was 12.0 percent. Furthermore, the present invention has been used to fabricate solar cells from physical vapor-deposited CdTe/CdS films in excess of 13%.

While the invention has been described with reference to details of the illustrated embodiment, these details are not intended to limit the scope of the invention as defined in the appended claims.

The embodiment of the invention in which an exclusive property or privilege is claimed is defined as follows:

1. An all dry method for fabricating solar cells, the method comprising:
   a) heating a film of a tellurium-containing compound;
   b) treating said film with halogen-containing vapor;
   c) subjecting said film to a reducing atmosphere;
   d) forming a tellurium layer onto said film;
   e) depositing copper onto the tellurium layer;
   f) heat treating to form copper telluride; and
   g) depositing a conductor onto the copper telluride.

2. The method as recited in claim 1, wherein the tellurium-containing compound is heated to between 500° C. and 650° C.

3. The method as recited in claim 1, wherein the tellurium-containing compound is heated for between 2 and 30 minutes.

4. The method as recited in claim 1, wherein the step of depositing copper includes heating the tellurium layer.

5. The method as recited in claim 1, wherein the halogen is contained in a compound selected from the group consisting of $CdCl_2$, NaCl, KCl, $NH_4Cl$, CuCl, $ZnCl_2$, $CdBr_2$, and combinations thereof.

6. The method as recited in claim 1, wherein the step of treating the film with halogen occurs at between 350° C. and 500° C.

7. The method as recited in claim 1, wherein the step of treating with halogen occurs for 2 to 30 minutes.

8. The method as recited in claim 1, wherein the reducing atmosphere comprises hydrogen and the hydrogen partial pressure is from 5 Torr to 760 Torr.

9. The method as recited in claim 8, wherein the step of subjecting the film with reducing atmosphere of hydrogen occurs between 200° C. and 400° C.

10. The method as recited in claim 8, wherein the step of subjecting the film with reducing atmosphere of hydrogen occurs for 10 seconds to 10 minutes.

11. The method as recited in claim 1, wherein the layer of tellurium has a thickness of between 5 Å and 300 Å.

12. The method as recited in claim 1, wherein the copper is deposited onto the tellurium to a thickness of between 4 Å and 200 Å.

13. The method as recited in claim 1, wherein the copper telluride is heated to between 50° C. and 300° C.

14. The method as recited in claim 1, wherein the copper telluride is heated for between 10 and 60 minutes.

15. The method as recited in claim 1, wherein the copper telluride is heated in a vacuum.

* * * * *